US007346177B2

(12) United States Patent
Willems

(10) Patent No.: US 7,346,177 B2
(45) Date of Patent: Mar. 18, 2008

(54) METHOD AND APPARATUS FOR GENERATING AUDIO COMPONENTS

(75) Inventor: Stefan Margheurite Jean Willems, Leuven (BE)

(73) Assignee: Koninklijke Philips Electronics N. V., Eindhoven (NL)

( * ) Notice: Subject to any disclaimer, the term of this patent is extended or adjusted under 35 U.S.C. 154(b) by 0 days.

(21) Appl. No.: 10/534,316

(22) PCT Filed: Oct. 20, 2003

(86) PCT No.: PCT/IB03/04615

§ 371 (c)(1), (2), (4) Date: May 9, 2005

(87) PCT Pub. No.: WO2004/044895

PCT Pub. Date: May 27, 2004

(65) Prior Publication Data

US 2006/0120539 A1 Jun. 8, 2006

(30) Foreign Application Priority Data

Nov. 12, 2002 (EP) .................................. 02079734

(51) Int. Cl.
*H03G 5/00* (2006.01)

(52) U.S. Cl. .......................................... 381/98; 381/61

(58) Field of Classification Search .................. 381/61, 381/94.1, 98; 704/219; 84/736
See application file for complete search history.

(56) References Cited

U.S. PATENT DOCUMENTS 6,111,960 A 8/2000 Aarts et al.
2002/0097807 A1 7/2002 Gerrits

FOREIGN PATENT DOCUMENTS

WO WO02086867 A 10/2002

*Primary Examiner*—Ping Lee

(57) ABSTRACT

The method and apparatus of generating a naturally sounding output audio signal (120) by adding missing output components (125) in a predetermined first frequency range (R1) to an input signal (100), set a first output energy measure (S1), over a predetermined first time interval (dt1), of the output components (125) generated based upon a first input energy measure (E1) calculated over a predetermined second time interval (dt2) of second input components (104), in a predetermined third frequency range (R3) of the input audio signal (100).

6 Claims, 6 Drawing Sheets

METHOD AND APPARATUS FOR GENERATING AUDIO COMPONENTS

Figure 1A:
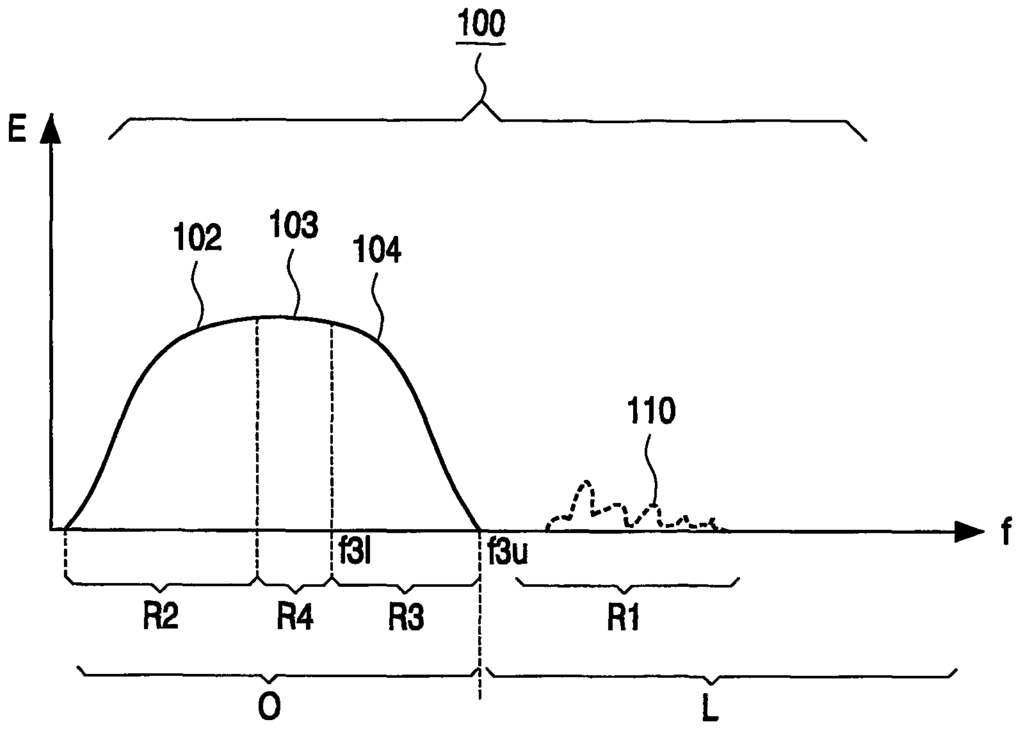

The invention relates to a method of generating an output audio signal by adding output components in a predetermined first frequency range to an input signal, the output components being generated by performing a predetermined calculation.

The invention also relates to an apparatus for generating output components in a predetermined first frequency range of an output audio signal, comprising calculation means for calculating the output components.

The invention also relates to an audio player, comprising audio data input means for providing input audio signal, and audio signal output means for outputting a final output audio signal, and containing the apparatus.

The invention also relates to a computer program for execution by a processor, describing a method.

The invention also relates to a data carrier storing a computer program for execution by a processor, the computer program describing the method.

An embodiment of the method described in the opening paragraph is known from U.S. Pat. No. 6,111,960. The known method generates high frequency output components by applying e.g. a squaring function to first components in the input signal. E.g., if output components are desired in a first frequency range between 10 and 12 kHz, they can be generated by the squaring function which doubles the frequency of first components in a predetermined second frequency range between 5 and 6 kHz. This is useful e.g. when the input audio signal is obtained by decompressing compressed audio like MP3 audio, in which no high frequency information is present. The lack of high frequency components results in that the audio sounds unnatural. The squaring function is a technically simple way to generate high frequency audio components.

It is a disadvantage of the known method that the output audio signal still sounds unnatural since the energy of the output components is directly determined by the energy of the squared first input components, and hence is not what is to be expected for high frequency components in a natural sound.

It is a first object of the invention to provide a method of the kind described in the opening paragraph, which yields an output audio signal which sounds relatively natural. It is a second object to provide an apparatus of the kind described in the opening paragraph, which is able to perform the method and to yield an output audio signal which sounds relatively natural.

The first object is realized in that a first output energy measure, over a predetermined first time interval, of the output components generated is set, based upon a first input energy measure calculated over a predetermined second time interval of second components, in a predetermined third frequency range of the input audio signal. The invention is amongst others based on the insight that the energy of high frequency components in a natural audio signal, and more specifically the fluctuation pattern of energy in time, is different from the energy of low frequency components. The energy of low frequency components changes slowly, whereas the energy of high frequency components changes rapidly. This is due to factors such as e.g. the period of the component, and different reflection and scattering characteristics of the environment for different components.

If a component of low frequency is squared, the amplitude of the resulting double frequency component is uniquely determined by the amplitude of the low frequency component. Similarly the energy of output components is determined by the energy of the first input components. This results in an energy fluctuation pattern for high frequency components which has the characteristics of a fluctuation pattern of low frequency components.

The method of the invention sets the energy of the output components, over a first predetermined time interval, which is preferably chosen small enough to be able to set rapidly fluctuating energy patterns as they typically occur in the frequency range of the output components, to a more realistic value. This is best done by analyzing the energy fluctuation pattern of the input signal, e.g. of second input components, in a predetermined third frequency range. Fixed scaling of output components is known from the prior art, but not modulating with the rapidly fluctuating energy pattern of preselected second input components.

In an embodiment, the third frequency range is selected from a predetermined number of frequency ranges, as the frequency range which is closest to the first frequency range according to a predetermined frequency range distance formula. Since low, mid and high frequency components generally all show different fluctuation patterns, further improved results are achieved when, the energy of the output components is set equal to the energy of components in a frequency close to the frequency range of the generated output components. E.g. if high frequencies are missing in the input audio signal and hence are generated, the highest frequency range from the number of available frequency ranges containing components of the input audio signal will have the most similar energy fluctuation pattern to what is natural for the output components.

In a variant on the method or its previous embodiment, the first output energy measure is set by further using a second input energy measure over a predetermined third time interval of third input components, in a predetermined fourth frequency range of the input audio signal. When measuring multiple energies of respective frequency ranges, it becomes possible to even estimate the change of energy fluctuation pattern for successive frequency ranges along the frequency axis. E.g. suppose that the fluctuation speed increases linearly from one frequency range to the next. Then the previous embodiment only performs a so-called zero order hold estimation of the required energy of the output components, whereas with two or more energy measurements other estimation possibilities are possible, such as e.g. a polynomial estimation.

It is advantageous if the predetermined calculation comprises applying a non-linear function to first input components in a predetermined second frequency range of an input audio signal. This is a technically simple way to realize the generation of the output components. Preferably, the input audio signal is divided in adjacent frequency ranges e.g. by band filtering and a non-linear function is applied to the band filtered signal in each frequency range. Another option is to use a frequency synthesizer to synthesize output components with a predetermined amplitude.

The second object is realized in that:

- filtering means are comprised for obtaining second input components in a third frequency range of the input audio signal;

energy calculation means are comprised for obtaining a first input energy measure over a second predetermined time interval of the second input components and deriving therefrom a first output energy measure; and energy setting means are comprised for setting the energy of the output components over a first predetermined time interval substantially equal to the first output energy measure.

If in the apparatus the input signal is band filtered by a number of band pass filters, the energies of the band limited signals outputted by the filters can be used for obtaining the output energy measures for a number of frequency ranges containing generated output components.

These and other aspects of the method, the apparatus, the audio player, the computer program and the data carrier according to the invention will be apparent from and elucidated with reference to the implementations and embodiments described hereinafter, and with reference to the accompanying drawings, which serve merely as non limiting illustrations.

Figure 2:
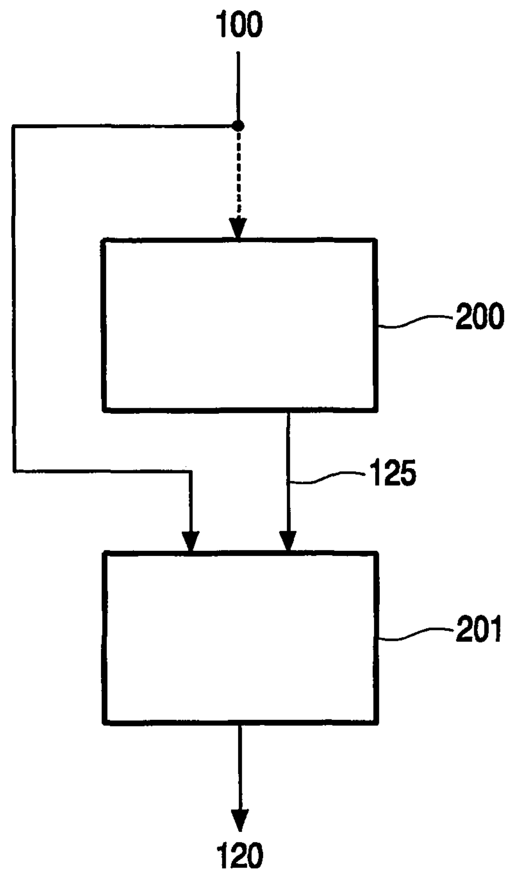
Figure 3:
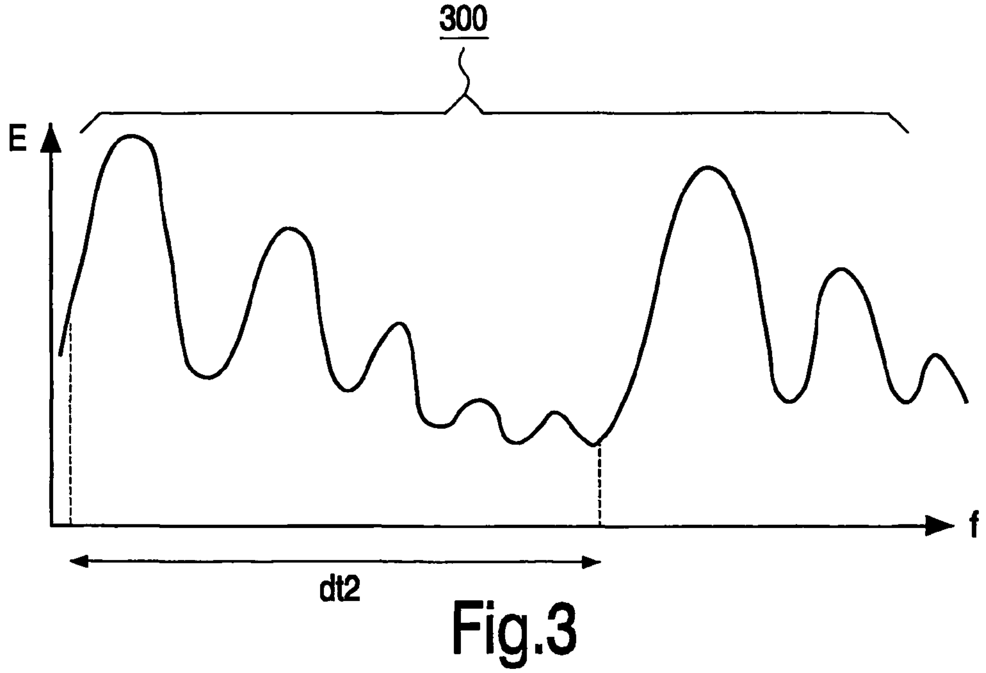
Figure 4A:
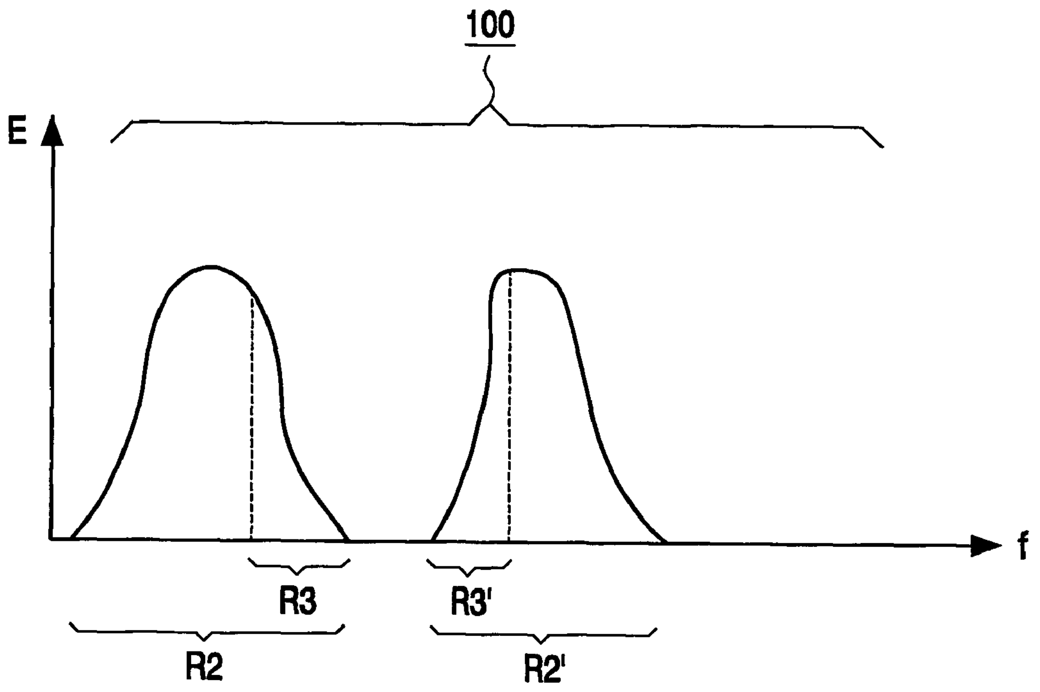
Figure 4B:
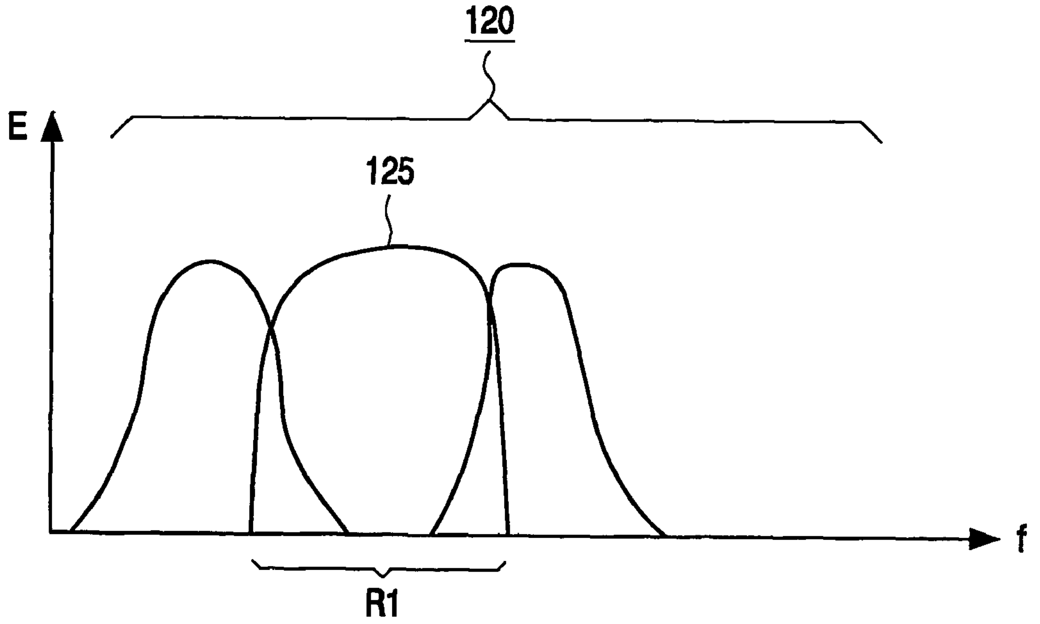
Figure 5:
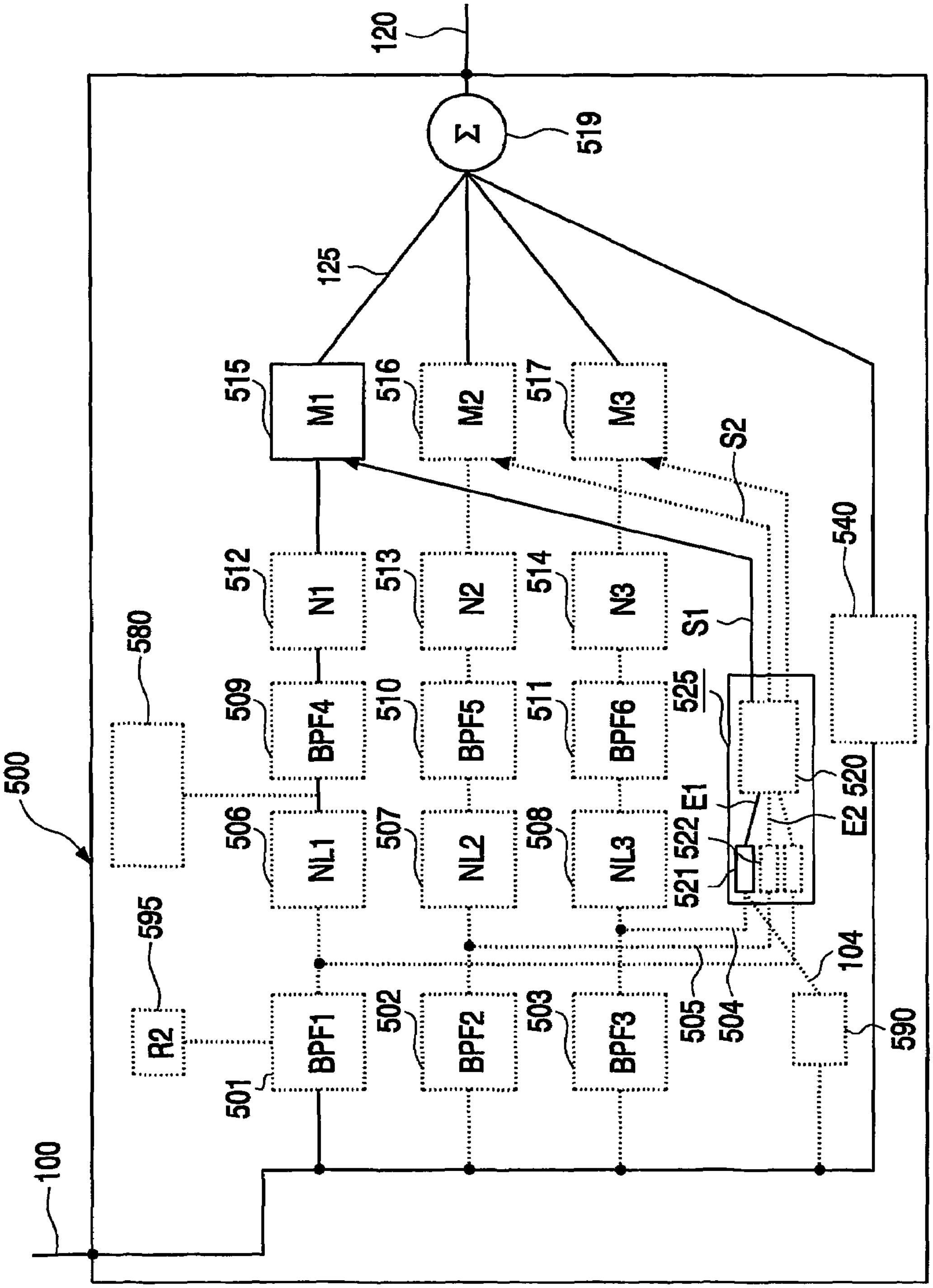
Figure 6:
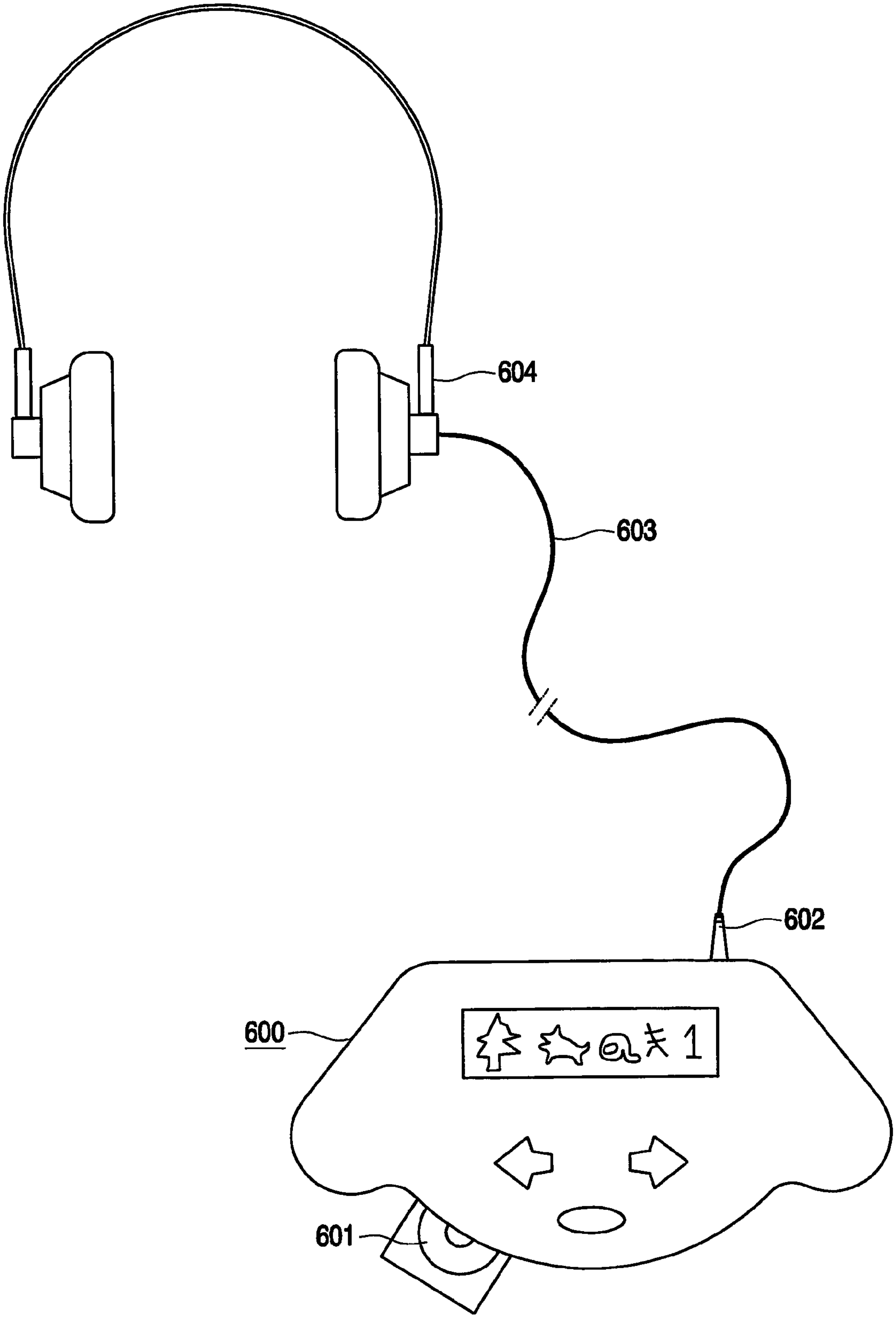

In the drawings:

FIG. 1 schematically shows an audio signal before and after applying the method according to the invention;

FIG. 2 schematically shows a flowchart of the method according to the invention;

FIG. 3 schematically shows a band pass filtered signal in time;

FIG. 4 schematically shows the method according to the invention for reconstructing missing components in a gap between input components;

FIG. 5 schematically shows an apparatus according to the invention;

FIG. 6 schematically shows an audio player.

Figure 7:
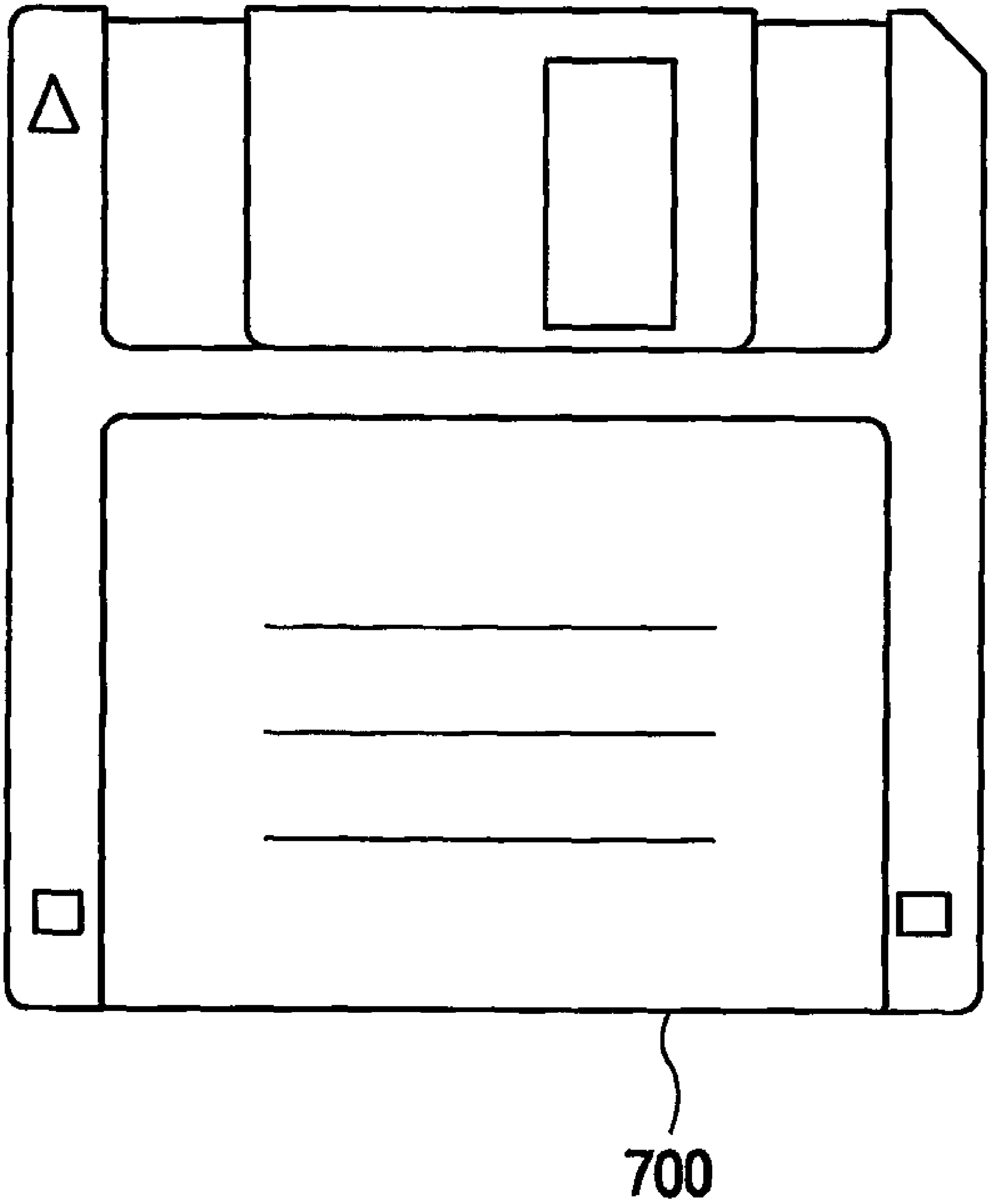

FIG. 7 schematically shows a data carrier.

In these Figures elements drawn dashed are optional or alternatives.

In FIG. 1, an input audio signal 100 is shown which symbolically contains first input components 102 in a second frequency range R2, second input components 104 in a third frequency range R3, and third input components 103 in a fourth frequency range R4. The frequency ranges R2, R3 and R4 are substantially included in a quality frequency range O. Input audio signal 100 also contains low quality components 110 in a low quality frequency range L, outside quality frequency range O. Such an input audio signal 100 is e.g. the result of decompressing a source of compressed audio, such as MPEG-1 audio layer 3 audio (MP3), advanced audio coding (AAC), windows media audio (WMA) or real audio.

Components are labeled as low quality- or quality-components by different labeling techniques, depending e.g. on the input audio signal 100 source, or depending on choices made concerning the realization of a particular embodiment of the method or apparatus according to the invention. In a first class of labeling techniques, certain frequency ranges are labeled a priori as quality frequency range O, or vice versa as low quality frequency range L, by a designer of an embodiment. E.g., it is possible that the source of input audio signal 100 is such, that there is no signal present outside quality frequency range O, or that there is just noise, which is not related to the input components 102, 103, 104 in the quality frequency range O. This occurs e.g. when the input audio signal 100 is decompressed from an MP3 source, for which a choice was made not to code frequencies above e.g. 11 kHz. For a low total amount of bits available to code an audio signal, e.g. below 64 kbps, spending bits on components above 11 kHz would imply that there are not enough bits for the components below 11 kHz, which results in annoying audible artifacts. Hence components with frequencies higher than 11 kHz are not coded, and are lost. For this MP3 source, the designer labels the components above 11 kHz as low quality components 110, and the frequency ranges R2, R3 and R4 are substantially below 11 kHz and in the quality frequency range O. A first frequency range R1 can be designed in such a manner that the method generates output components up to e.g. 16 kHz. In other words the designer implements in this way his desire that components should exist up to 16 kHz, which are artificially generated in a first frequency range R1 from 11 kHz to 16 kHz.

A second class of labeling techniques analyses the input audio signal in real time. This is realized by means of a quality measure, which indicates that the quality of components in a low quality frequency range L is inferior to the quality of components in the quality frequency range O. A possible quality measure is the number of bits spent on the components in the low quality frequency range, as compared to a predetermined threshold of bits known to give good perceptual quality. Such a threshold can be determined e.g. by means of listener panel tests. In particular if the quality of the components in the low quality frequency range L is lower than the quality of artificially generated output components 125 according to the method of the invention, it can be desirable to replace the low quality components 110 by the output components 125, at least in a first frequency range R1.

Figure 1B:
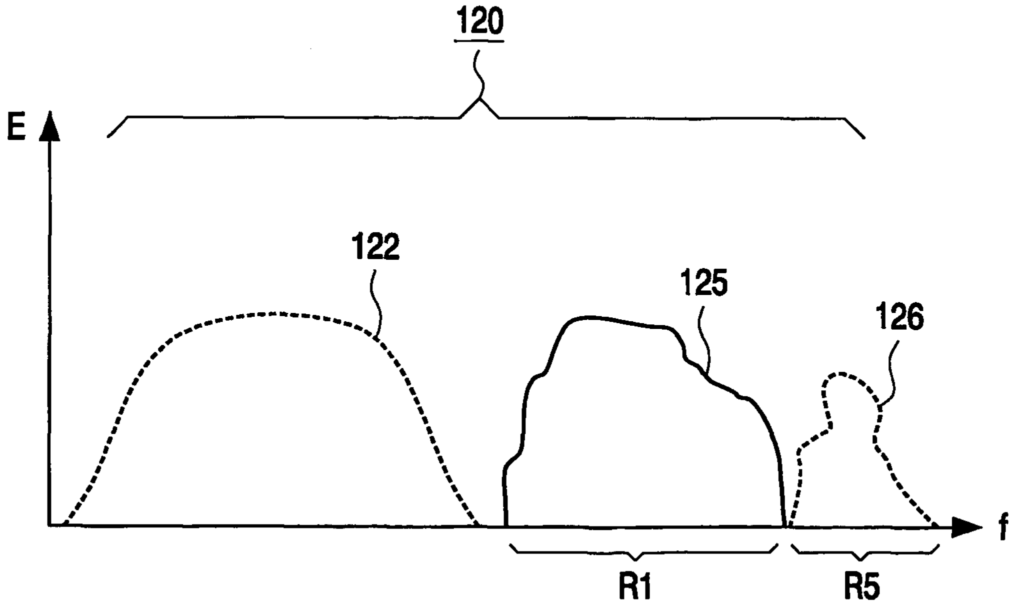

FIG. 1*b* shows an output audio signal 120, resulting from applying the method of the invention. Preferably, the output audio signal 120 contains original components 122, which are substantially identical to the components 102, 103, 104 in the quality frequency range O of the input audio signal 100. Alternatively, it might be preferable to replace e.g. some of the second input components 104 in the third frequency range R3 which are adjacent to the first frequency range R1, so that there is a better match between the original components 122 and output components 125, which are generated by performing a predetermined calculation 200 (see FIG. 2), e.g. a synthesis of the output components with a predetermined unity amplitude. The input components 102, 103, 104 may also undergo a number of predetermined transformations, such as filtering, before being copied as original components 122.

The output components 125 can be generated by a number of variants of the calculation 200. E.g., loss of high frequency components in an MP3 coded audio signal is clearly audible, and hence it is preferred that frequencies above e.g. 11 kHz are generated. A first variant, which is the variant of a preferred embodiment of the method—for which a corresponding apparatus is schematically shown in FIG. 5—generates the output components 125 on the basis of first input components 102 in a predetermined second frequency range R2 of the input audio signal 100, e.g. by calculation means 506 being a non linear function calculation—e.g. on a DSP or as a circuit—which applies a non linear function to the first input components 102. When the non linear function is e.g. a squaring, according to Eq. 1 output components O(t) 125 of double frequency compared to the frequency of the first input components I(t) 102 are generated:

$$O(t) = f[I(t) = \sin wt] = \sin^2 wt = \frac{1}{2}(1 - \cos 2wt) \quad \text{[Eq. 1]}$$

Hence when output components in the first frequency range R1 are required, a second frequency range R2 can be defined as bounded by bounds of half the frequency of the bounds of R1. Another option is to filter away second harmonics that are outside the predetermined first frequency range R1. Other non-linear functions can generate other higher harmonics, e.g. of triple frequency. An interesting non-linear function to apply on the first input components 102 is an absolute value. Application of a squaring function has a disadvantage that the amplitude of the output components 125 is the square of the amplitude of the first input components 102, which introduces perceptible artifacts. To correct for the squared amplitude dependency, a square root of the output components 125 should preferably be calculated. The squaring and square root functions can be combined into an absolute value operation.

A second variant of the calculation 200 does not make use of the first input components 102 of the input audio signal 100. When the method is executed e.g. on a digital signal processor (DSP), the output components are synthesized by signal synthesizer 580 in the first frequency range with a predetermined amplitude, as is well known from the art. With this variant the input audio signal 100 is not used to generate the output components 125, but it will be used in the setting part 201 (see FIG. 2) of the method.

In the setting part 201 of the method, a first input energy measure E1 is calculated for the second input components 104 over a second predetermined time interval dt2 as shown in FIG. 3. The second input components 104 can be obtained by producing a band limited signal 300, which is a part of the input audio signal 100 restricted to the frequencies of a third frequency range R3, i.e. obtained e.g. after filtering the input audio signal 100 with a band pass filter such as 503. The first input energy measure E1 for a certain time instance t is then e.g. calculated by means of Eq. 2:

$$E1(t) = \int_{t-dt2/2}^{t+dt2/2} P_{BL}(t)\,dt, \qquad \text{[Eq. 2]}$$

in which $P_{BL}(t)$ is the instantaneous audio power of the band-limited signal 300. Instead of using a multiband decomposition of the input audio signal, a discrete Fourier transform can also be used, in which case the first input energy measure E1 can be calculated e.g. by means of Eq. 3:

$$E1(t) = \int_{t-dt2/2}^{t+dt2/2} \int_{f3l}^{f3u} P_{BL}(t, f)\,df\,dt, \qquad \text{[Eq. 3]}$$

in which f3l and f3u are the lower and upper frequency of the third frequency range R3. The second predetermined time interval dt2 should be chosen small enough so that energy fluctuations of the input audio signal 100 can be accurately tracked. E.g. if the input audio signal 100 contains music of which the energy in the third frequency range R3 changes appreciably every $100^{th}$ of a second, the second predetermined time interval dt2 should be no larger than a $100^{th}$ of a second. From the first input energy measure E1 a first output energy measure S1 over a predetermined first time interval dt1 is derived. In a simple embodiment, the first time interval dt1 equals the second time interval dt2, and the first output energy measure S1 equals the first input energy measure E1.

In an audio signal, components in different frequency ranges show different energy fluctuation patterns. E.g. low frequencies typically fluctuate slowly, whereas high frequencies fluctuate rapidly. Since in the first variant of the calculation 200 the output components 125 are derived from the first input components 102, which in FIG. 1 are low frequencies, the energy fluctuation pattern of the output components 125 without applying the setting part 201 of the method, is substantially the energy fluctuation pattern of the first input components 102, hence typical of low frequencies, rather than a high frequency energy fluctuation pattern as is expected for a naturally sounding output signal 120. Hence to make the output audio signal 120 sound more natural, the first output energy measure S1($t$) has to be set to a value which is more typical of high frequencies. A first output energy measure selection variant has a predetermined number of frequency ranges to its disposal, e.g. R2, R3 and R4. The preferred frequency range for determining the first output energy measure S1 is the third frequency range R3, since it is the one of the predetermined frequency ranges—containing quality audio components—which contains the highest frequencies. Its energy fluctuation pattern will probably be most similar to a natural energy fluctuation pattern for the even higher frequencies in the first frequency range R1 of the output components. If second output components 126 are generated, e.g. by squaring the second input components 104 in the third frequency range R3, R3 is again a good choice for obtaining its second output energy measure S2($t$). In this variant, a so called first order hold estimation of the output energy measures S1, S2 of the output components 125, 126 is employed, by using the closest frequency range, namely the third frequency range R3.

For determining which frequency range is the closest, a number of frequency range distance formulae can be used. If the frequency ranges are non-overlapping, the upper and lower bounds can be used for calculating the distance D, as e.g. in Eqs. 4:

$D=f_l^{RX}-f_u^{R1}$ if frequency range RX contains frequencies higher than in R1

$D=f_l^{R1}-f_u^{RX}$ if RX contains frequencies lower than in R1 [Eq. 4], in which the indexes l and u indicate the lowest resp. highest frequency in a range. In case overlapping ranges are used, the difference between the median, midpoint or average frequencies for both frequency ranges can be used. The upper and lower bounds can be used for overlapping ranges also. The closest frequency range may alternatively be defined a priori by the designer of the method.

FIG. 4 shows a case of an input audio signal 100 for which output components 125 have to be generated in between two frequency ranges R2 and R2' containing quality audio. R3 and R3' are now candidates for being the closest frequency range, which has an energy fluctuation most similar to what is to be expected for the first output energy measure S1($t$) of the output components 125 next to them. In case of equal distance, a heuristic can e.g. prefer the one containing the lowest frequencies. The output audio signal 120 can be formed by e.g. copying the components from the input audio signal 100 in the parts of the frequency ranges R2 and R2' outside the first frequency range R1, and generating output components in the first frequency range R1 on the basis of components from R2 and R2'.

Instead of using a zero order hold estimation for the output energy measures S1 resp. S2 of the output components 125 and 126, more advanced estimations of a natural energy fluctuation pattern for the higher frequencies can be employed, if a second input energy measure E2 over a predetermined third time interval dt3 of third input components 103, in a predetermined fourth frequency range R4 of the input audio signal 100 is measured. If there is e.g. a linear decreasing trend of a time interval dtF of fluctuation in the frequency ranges R2, R4 and R3, this trend can be expected to continue and hence set for R1 and R5. dtF can be defined e.g. as a time interval in which the input energy measure of a frequency range as calculated by Eq. 2 has changed by 10%. The variation from frequency range to frequency range of other parameters like the standard deviation of the input energy measure can also be tracked and used in setting a naturally sounding energy fluctuation pattern for the higher frequencies, e.g. S1($t$) for the output components 125. More complicated non-linear estimations can also be employed.

Without departing from the scope of the invention, the setting part 201 and calculation 200 could be combined in a single part.

FIG. 5 schematically shows an apparatus 500 according to the invention. It is advantageous, before applying a non linear function to the input audio signal 100, e.g. an MP3 stream at 64 kbps upsampled to 44.1 kHz, to obtain output components 125, to first split up the input signal in a number of band pass filtered subsignals. Eq. 1 is only valid for a single frequency. If the squaring function is applied to a signal containing multiple frequencies, mixing terms are introduced, which creates distortion. E.g. in case of music introducing harmonics of instruments present is acceptable, but introducing other frequencies makes the music sound out of tune. So it is advantageous to apply multiple non-linear functions 506, 507 and 508, on subsignals in adjacent relatively narrow frequency bands created by means of band pass filters 501, 502 and 503. The pass bands of the filters can be chosen according to the IEC 1260 standard, containing tierces, e.g. centered at 5 kHz, 6.3 kHz and 8 kHz. The filters may be fixed or adaptive, in which case a range providing unit 595—e.g. a memory containing a fixed value, or an algorithm supplying a calculated value—may be present. Further filters 509, 510 and 511 may be present to pass signals in the corresponding double frequency bands 10 kHz, 12.5 kHz and 16 kHz. If the non linear functions are absolute value functions, many harmonics are generated, but only the second harmonic may be desirable since the other harmonics only distort the output audio signal 120, in which case the other harmonics are filtered out by filters 509, 510 and 511. The non-linear functions can be embodied in hardware as in the prior art or as an algorithm running on a DSP. Instead of being a battery of non linear functions, the calculation means can also be realized as a signal synthesizer 580, which is e.g. an algorithm which synthesizes components of equal amplitude for all frequencies in the first frequency range R1. Filter 590 generates a band limited signal corresponding to the second input components 104, e.g. as a band pass filter, and is connected to a first energy measuring unit 521, part of an energy calculation unit 525. Alternatively, for reasons of economy, the second input components 104 can also be chosen from among the subsignals, e.g. by providing a signal path 504 between the band limited subsignal outputted by the third band pass filter 503 and the first energy measuring unit 521. The first energy-measuring unit 521 measures the first input energy measure E1, e.g. according to Eq. 2, realized in hardware or software. From the first input energy measure E1 a first output energy measure S1 can be derived by an output energy specification unit 520, by means of a calculation, which if desired takes into account further input energy measures such as a second input energy measure E2, derived by a second energy measuring unit 522, on the basis of e.g. the signal outputted by the second band pass filter 502. A second output energy measure S2 can be derived in a similar way.

The output components 125 and if desired second output components 126 are generated as follows. First intermediate signals 593 resp. 594 resulting from calculation means 506 resp. 507, and possibly filtered by filters 509 resp. 510, are normalized to unit energy by normalization units 512 resp. 513. Then energy setting units 515 resp. 516 set the energy of the output components 125 and second output components 126 to the desired values S1 resp. S2 at all desired times t. Hence the energy setting units 515 resp. 516 function as amplitude modulators. They can be realized in software as an algorithm scaling each sample with the factor S1 resp. S2, or in hardware as a multiplier or a controlled amplifier. The generated output components 125 and second output components 126 are added by an adder 519 to the quality components of the input signal 100. The input signal can optionally be processed by a conditioning unit 540, which e.g. comprises filtering out components in the low frequency range L.

FIG. 6 shows an example of an audio player 600 in which an apparatus according to the invention is comprised. The audio player 600 in FIG. 6 is a portable MP3 player, but could also be e.g. an Internet radio. Another product comprising the apparatus or applying the method according to the application is an audio player which generates e.g. a Super Audio CD (SACD)—like signal from a CD signal. The audio player 600 comprises an audio data input 601, e.g. a disk reader, or a connection to the Internet, from which compressed music is downloaded in a memory. The audio player 600 also comprises an audio signal output 602 for outputting a final output audio signal 603 after processing, which may connect to headphones 604.

It should be noted that the above-mentioned embodiments illustrate rather than limit the invention and that those skilled in the art are able to design alternatives, without departing from the scope of the claims. Apart from combinations of elements of the invention as combined in the claims, other combinations of the elements within the scope of the invention as perceived by one skilled in the art are covered by the invention. Any combination of elements can be realized in a single dedicated element. Any reference sign between parentheses in the claim is not intended for limiting the claim. The word "comprising" does not exclude the presence of elements or aspects not listed in a claim. The word "a" or "an" preceding an element does not exclude the presence of a plurality of such elements.

The invention can be implemented by means of hardware or by means of software running on a computer.

The invention claimed is:

1. A method of generating an output audio signal by adding output components in a predetermined first frequency range to an input signal, the output components being generated by performing a predetermined calculation on first input components in a predetermined second frequency range, characterized in that a first output energy measure, over a predetermined first time interval, of the output components generated is set, based upon a first input energy measure calculated over a predetermined second time interval of second input components, in a predetermined third frequency range of the input audio signal, wherein the predetermined third frequency range is different from the predetermined second frequency range, and is selected from a predetermined number of frequency ranges, as the frequency range which is closest to the first frequency range according to a predetermined frequency range distance formula.

2. The method as claimed in claim 1, wherein the predetermined calculation comprises applying a non linear function to first input components in a predetermined second frequency range of an input audio signal.

3. A method of generating an output audio signal by adding output components in a predetermined first frequency range to an input signal, the output components being generated by performing a predetermined calculation on first input components in a predetermined second frequency range, characterized in that a first output energy measure, over a predetermined first time interval, of the output components generated is set, based upon a first input energy measure calculated over a predetermined second time interval of second input components, in a predetermined third frequency range of the input audio signal, wherein the predetermined third frequency range is different from the predetermined second frequency range, and is selected from a predetermined number of frequency ranges, as the frequency range which is closest to the first frequency range according to a predetermined frequency range distance formula, wherein the first output energy measure is set by further using a second input energy measure over a predetermined third time interval of third input components, in a predetermined fourth frequency range of the input audio signal.

4. An apparatus for generating an output audio signal by adding output components in a predetermined first frequency range to an input audio signal, said apparatus comprising:

- calculation means for calculating the output components from first input components in a predetermined second frequency range of the input audio signal;
- filtering means obtaining second input components in a third frequency range of the input audio signal;
- energy calculation means for obtaining a first input energy measure over a second predetermined time interval of the second input components and deriving therefrom a first output energy measure; and
- energy setting means for setting the energy of the output components over a first predetermined time interval substantially equal to the first output energy measure, wherein the predetermined third frequency range is different from the predetermined second frequency range, and is selected from a predetermined number of frequency ranges, as the frequency range which is closest to the first frequency range according to a predetermined frequency range distance formula.

5. An audio player comprising:

- audio data input means for providing an input audio signal;
- an apparatus for generating an output audio signal as claimed in claim 4; and
- signal output means for receiving the output audio signal from said apparatus.

6. A computer readable medium storing a computer program for execution by a processor, the computer program causing the processor to generate an output audio signal by adding output components in a predetermined first frequency range to an input signal, and to generate the output components by performing a predetermined calculation on first input components in a predetermined second frequency range, characterized in that the computer program causes the processor to set a first output energy measure, over a predetermined first time interval, of the generated output components, based upon a first input energy measure calculated over a predetermined second time interval of second input components, in a predetermined third frequency range of the input audio signal, wherein the predetermined third frequency range is different from the predetermined second frequency range, and is selected from a predetermined number of frequency ranges, as the frequency range which is closest to the first frequency range according to a predetermined frequency range distance formula.

* * * * *